United States Patent
Meiser et al.

(10) Patent No.: US 9,608,070 B2
(45) Date of Patent: Mar. 28, 2017

(54) SEMICONDUCTOR DEVICE COMPRISING A FIELD EFFECT TRANSISTOR AND METHOD OF MANUFACTURING THE SEMICONDUCTOR DEVICE

(71) Applicant: Infineon Technologies AG, Neubiberg (DE)

(72) Inventors: Andreas Meiser, Sauerlach (DE); Till Schloesser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/139,758

(22) Filed: Apr. 27, 2016

(65) Prior Publication Data

US 2016/0322464 A1 Nov. 3, 2016

(30) Foreign Application Priority Data

Apr. 29, 2015 (DE) .................. 10 2015 106 683

(51) Int. Cl.
| | |
|---|---|
| *H01L 29/10* | (2006.01) |
| *H01L 29/78* | (2006.01) |
| *H01L 29/06* | (2006.01) |
| *H01L 29/40* | (2006.01) |

(Continued)

(52) U.S. Cl.
CPC ........ *H01L 29/1087* (2013.01); *H01L 29/063* (2013.01); *H01L 29/0696* (2013.01); *H01L 29/1095* (2013.01); *H01L 29/402* (2013.01); *H01L 29/4175* (2013.01); *H01L 29/66704* (2013.01); *H01L 29/7825* (2013.01)

(58) Field of Classification Search
CPC ... H01L 29/10; H01L 29/109; H01L 29/1095; H01L 29/06; H01L 29/069; H01L 29/0696; H01L 27/08; H01L 27/088; H01L 21/76; H01L 21/761
USPC ......................................................... 257/337
See application file for complete search history.

(56) References Cited

U.S. PATENT DOCUMENTS

| 7,910,983 B2 * | 3/2011 | Willmeroth ........... H01L 29/407 257/139 |
| 2003/0141514 A1 | 7/2003 | Yamaguchi |

FOREIGN PATENT DOCUMENTS

DE  102013113284  6/2014

OTHER PUBLICATIONS

Office Action communication of the German Patent and Trademark Office for Appln. Ser. No. 102015106683.1, Jan. 22, 2016.

* cited by examiner

*Primary Examiner* — Monica D Harrison
(74) *Attorney, Agent, or Firm* — Baker Botts L.L.P.

(57) ABSTRACT

A semiconductor device comprises a field effect transistor in a semiconductor substrate having a first main surface. The field effect transistor comprises a source region, a drain region, a body region, and a gate electrode at the body region. The gate electrode is configured to control a conductivity of a channel formed in the body region, and the gate electrode is disposed in gate trenches. The body region is disposed along a first direction between the source region and the drain region, the first direction being parallel to the first main surface. The body region has a shape of a ridge extending along the first direction, the body region being adjacent to the source region and the drain region. The semiconductor device further comprises a source contact and a body contact, the source contact being electrically (Continued)

connected to a source terminal, the body contact being electrically connected to the source contact and to the body region.

20 Claims, 14 Drawing Sheets

(51) Int. Cl.
*H01L 29/417* (2006.01)
*H01L 29/66* (2006.01)

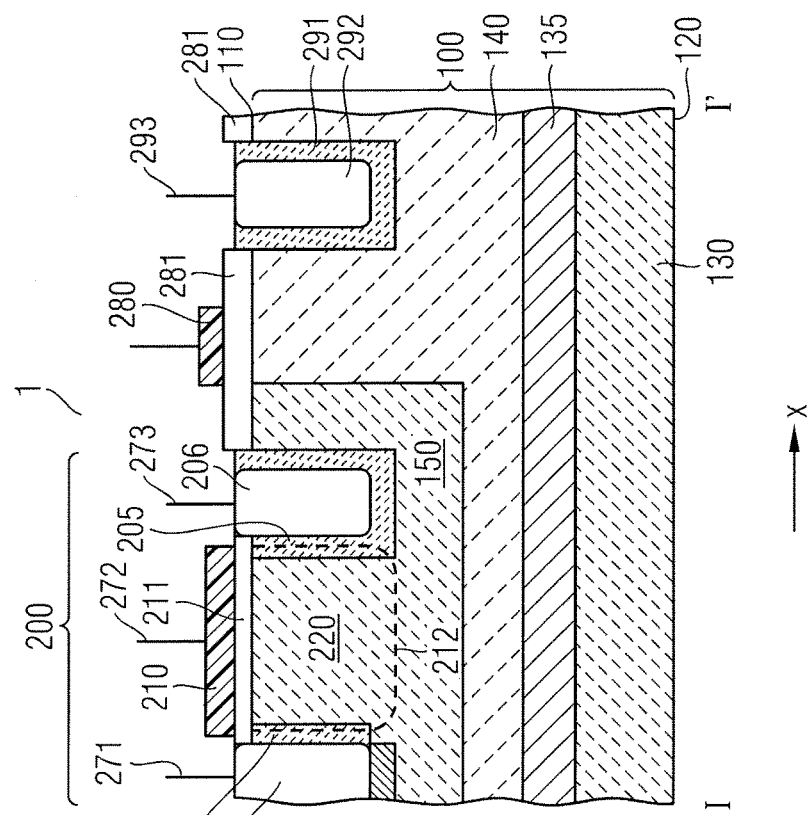
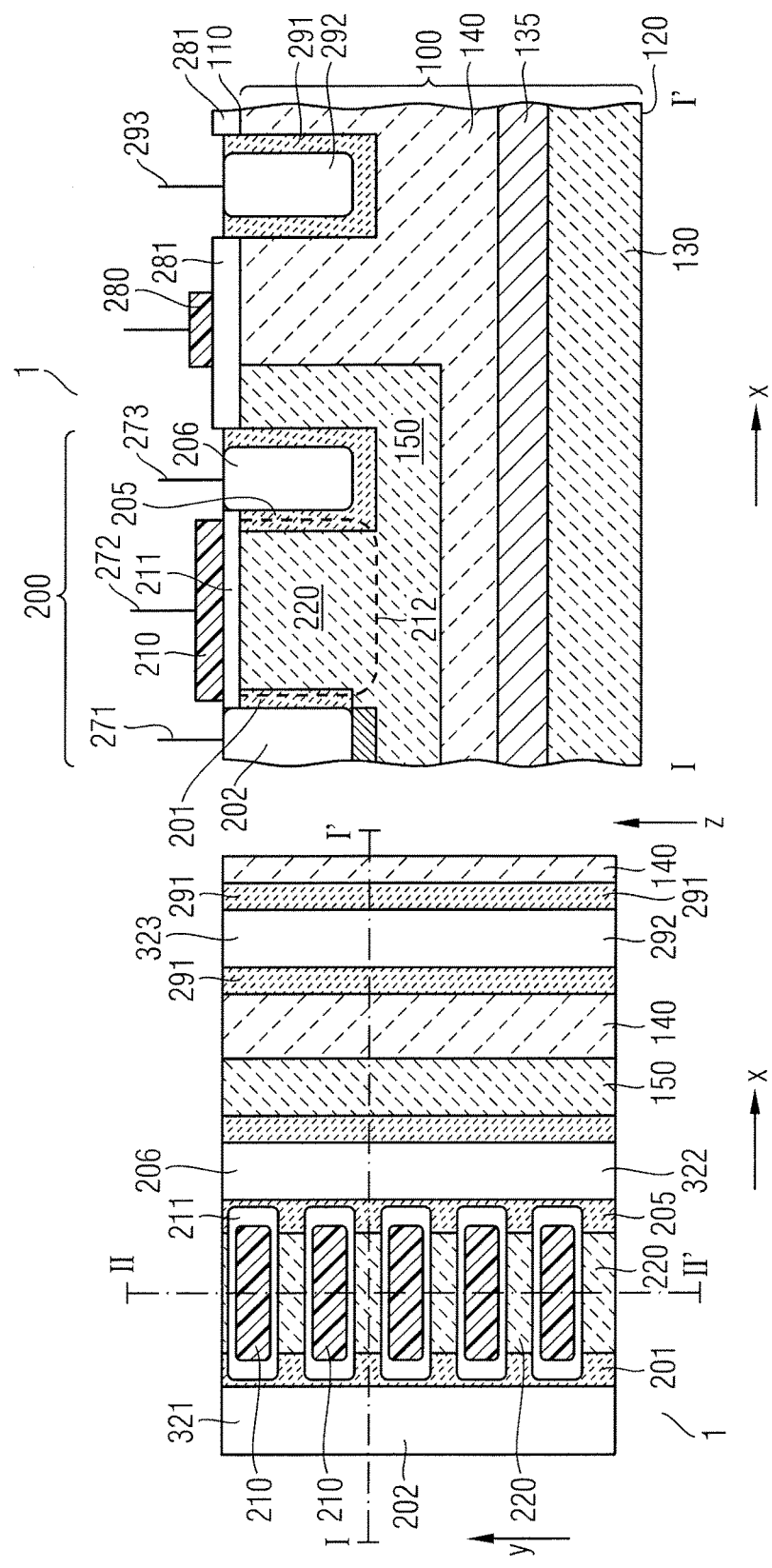

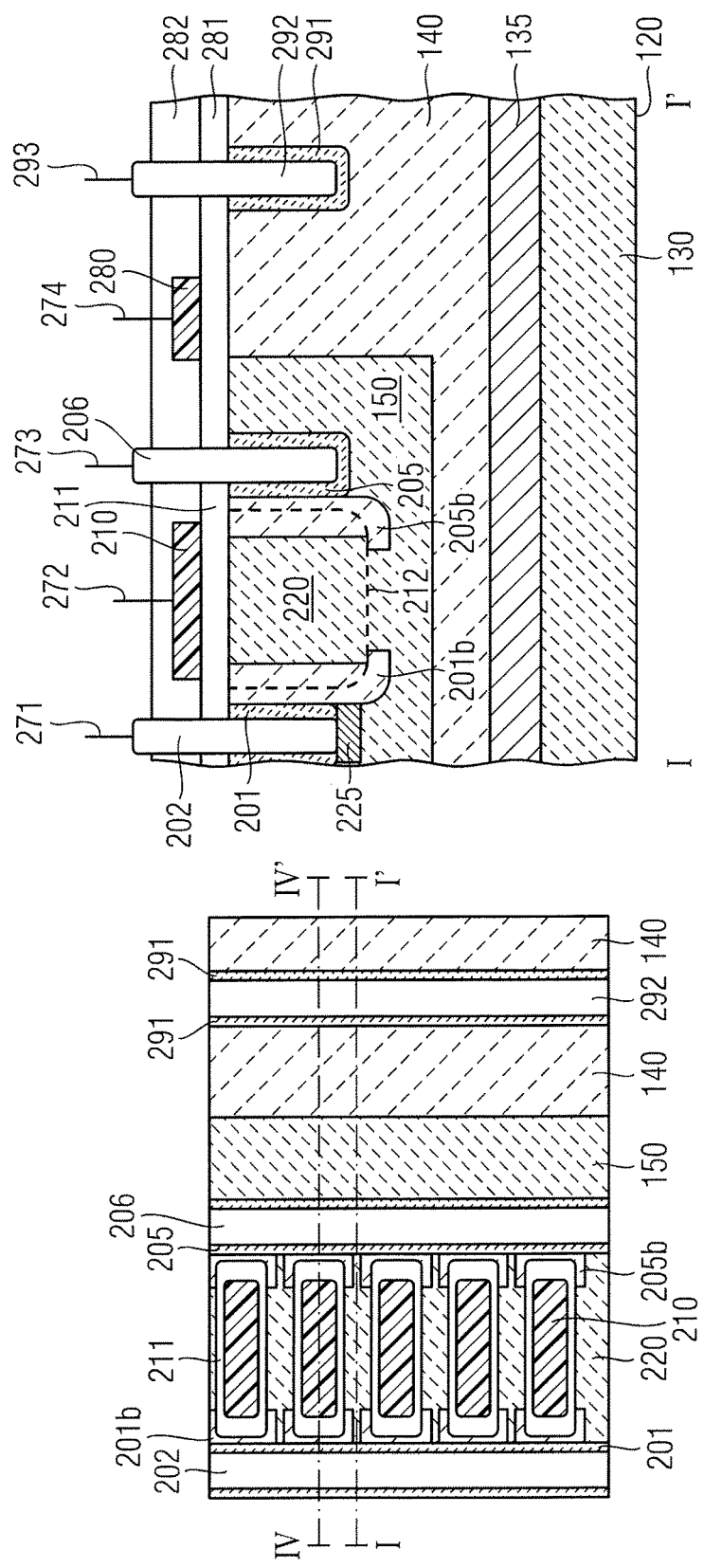

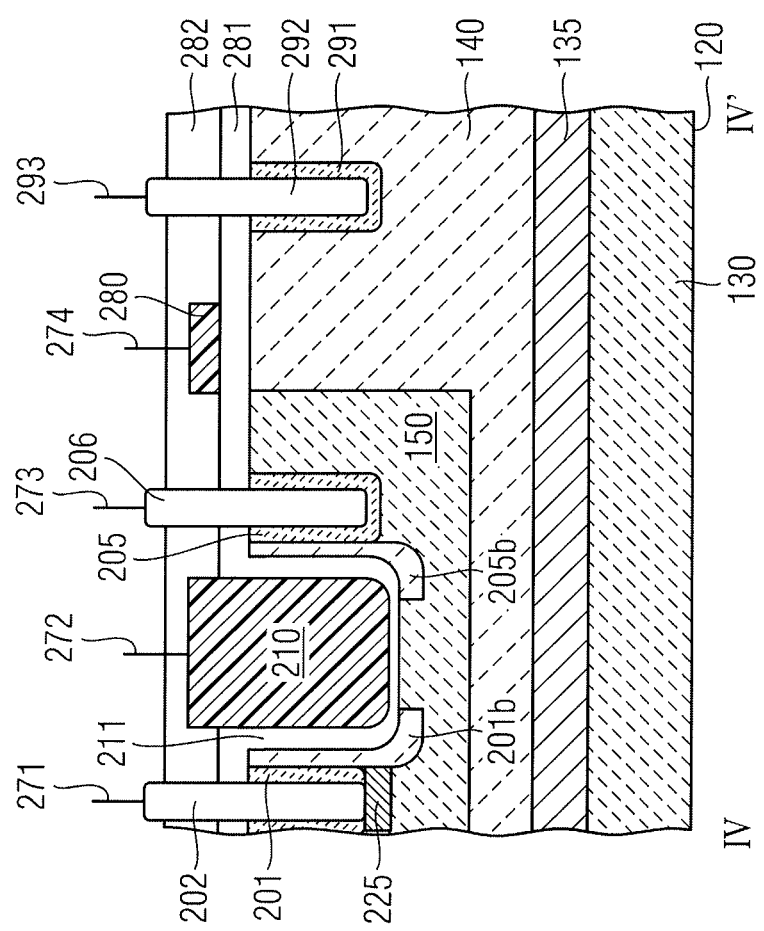

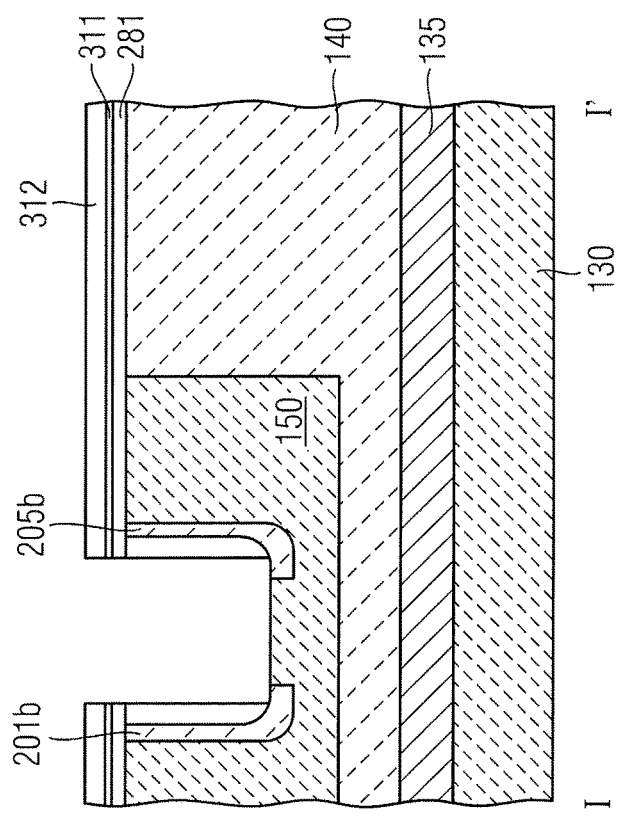
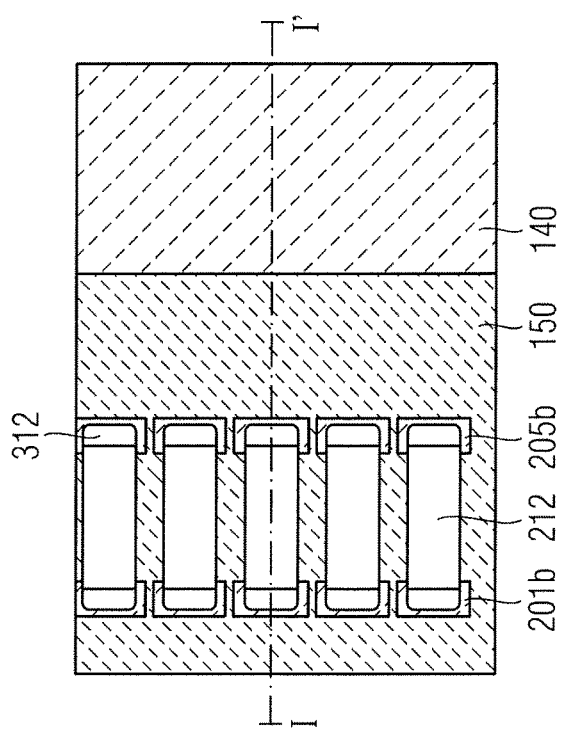

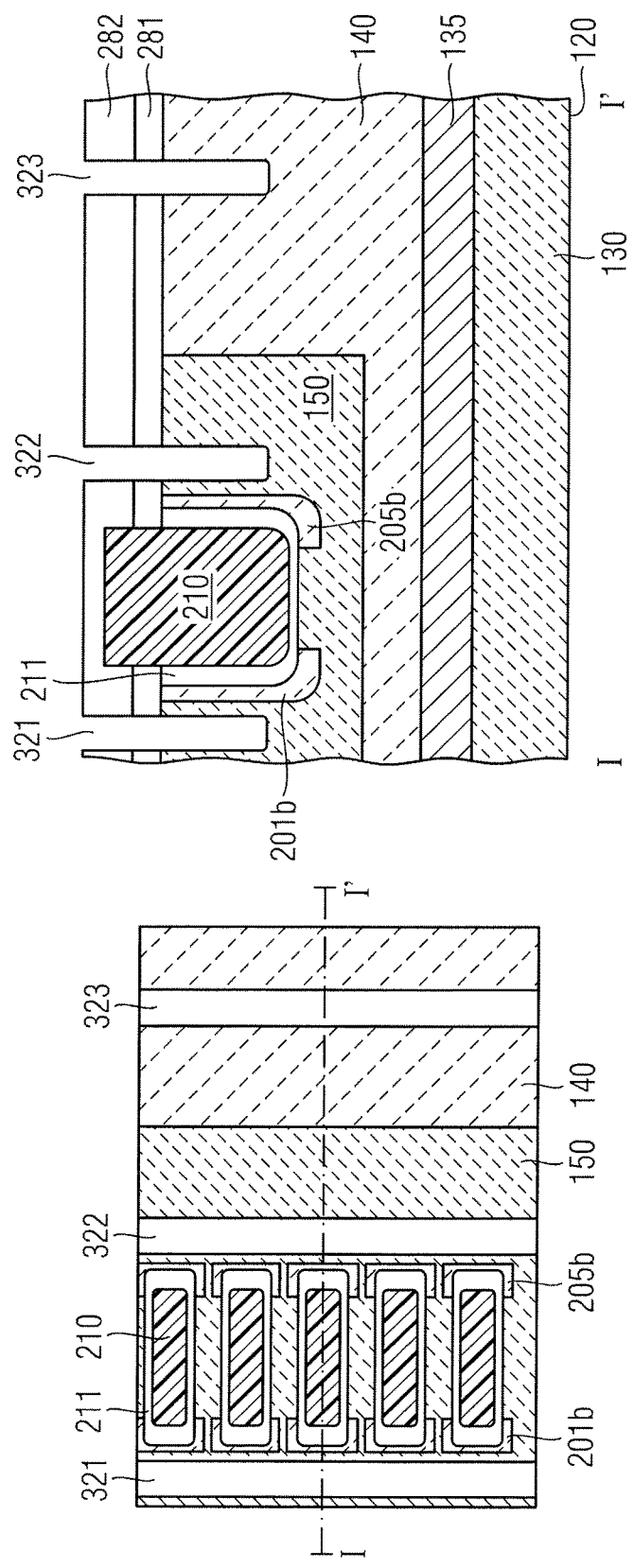

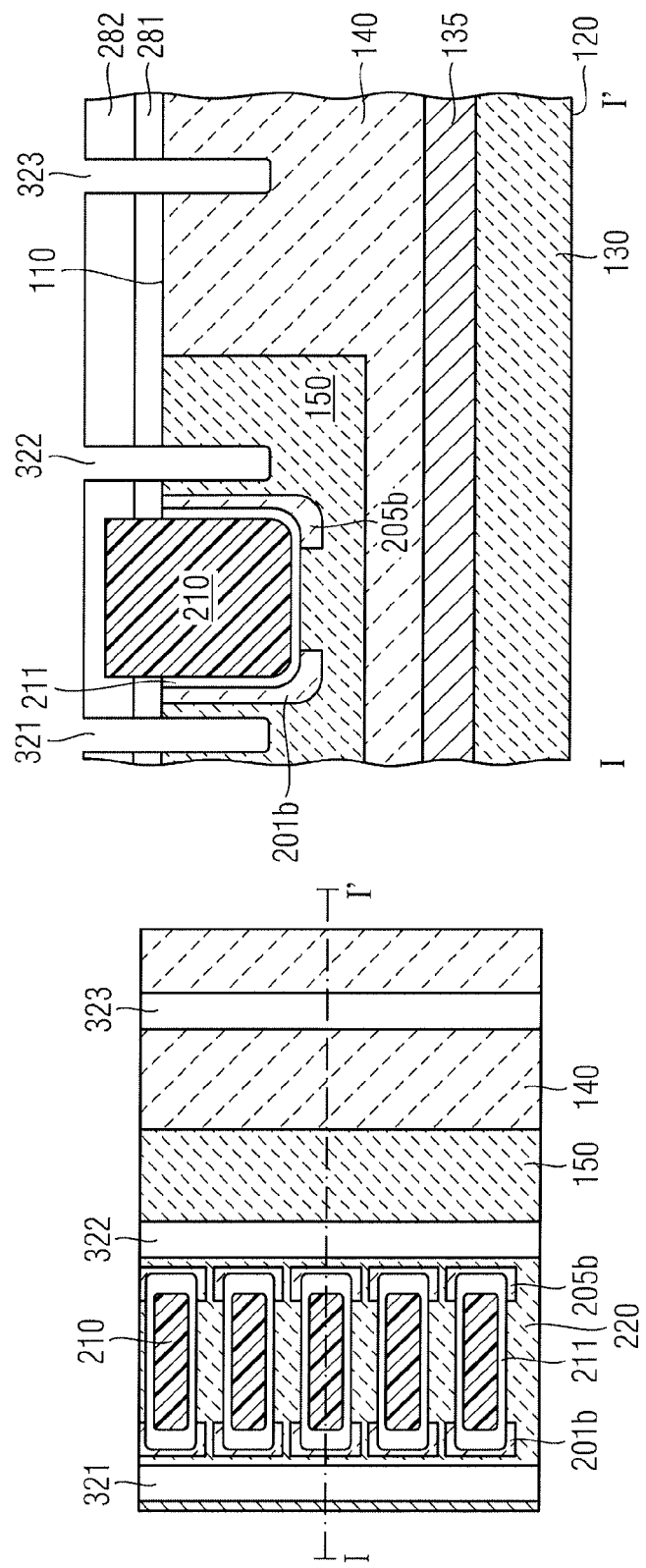

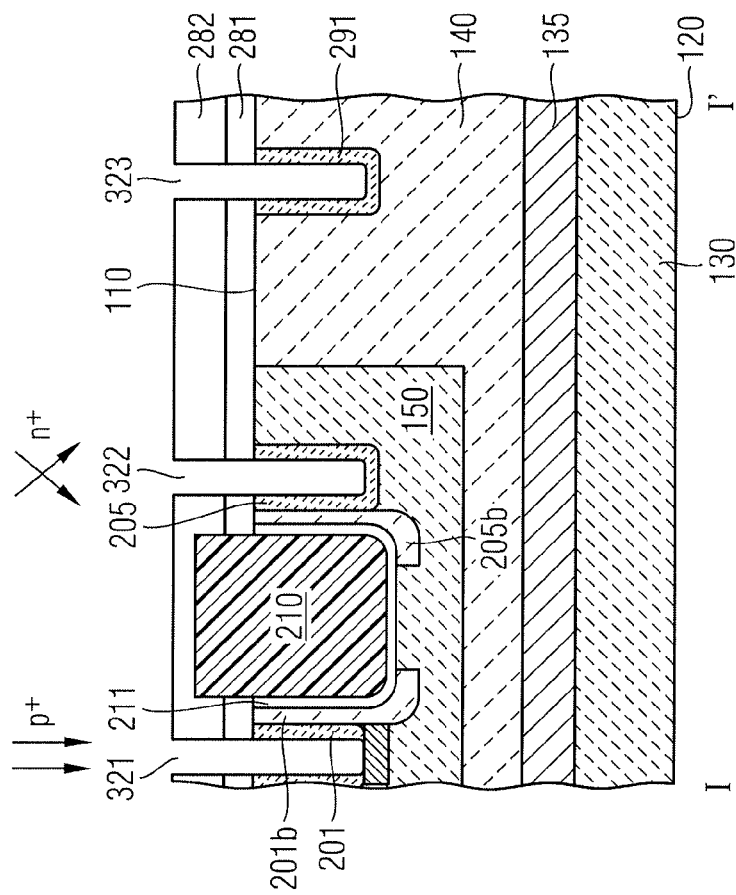
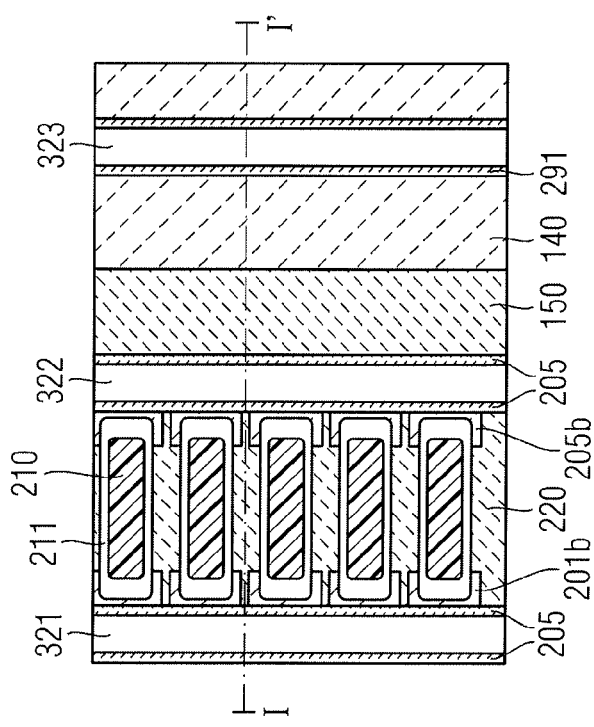

SEMICONDUCTOR DEVICE COMPRISING A FIELD EFFECT TRANSISTOR AND METHOD OF MANUFACTURING THE SEMICONDUCTOR DEVICE

CROSS-REFERENCE TO RELATED APPLICATION

This application claims priority to German Application Serial No. 102015106683.1 filed Apr. 29, 2015 and entitled "Semiconductor Device Comprising a Field Effect Transistor and Method of Manufacturing the Semiconductor Device".

BACKGROUND

Power transistors commonly employed in automotive and industrial electronics require a low on-state resistance (Ron A), while securing a high voltage blocking capability. For example, a MOS ("metal oxide semiconductor") power transistor should be capable, depending upon application requirements, to block drain to source voltages Vds of some tens to some hundreds or thousands of volts. MOS power transistors typically conduct very large currents which may be up to some hundreds of Amperes at typical gate-source voltages of about 2 to 20 V. Low-voltage power transistors are applied in a drain to source voltage range Vds below 10 Volts.

Lateral power devices, in which a current flow mainly takes place parallel to a first main surface of a semiconductor substrate, are useful for integrated circuits in which further components, such as switches, bridges and control circuits are integrated. Generally, transistors are being investigated which may be used as a low-resistive low-voltage power switch and which may be integrated with a driver circuit.

Accordingly, it is an object of the present invention to provide an improved semiconductor device meeting the above-defined demands. Further, it is an object to provide a method for manufacturing such a semiconductor device.

SUMMARY

According to an embodiment, a semiconductor device comprises an array of field effect transistors in a semiconductor substrate having a first main surface. The array of field effect transistors includes a source contact trench and a drain contact trench, each running in a second direction parallel to the first surface, a conductive material in the source contact trench forming a source contact and a conductive material in the drain contact trench forming a drain contact, the source contact trench and the drain contact trench being formed in the first main surface. The array of field effect transistors further comprises gate electrode structures and body regions, extending between the source contact trench and the drain contact trench. The gate electrode structures and the body regions are arranged in an alternating manner along the second direction. The array of field effect transistors further comprises a source region electrically connected to the conductive material in the source contact trench and adjacent to the body regions and a drain region electrically connected to the conductive material in the drain contact trench and adjacent to the body regions. The array of field effect transistor further comprises a body contact adjacent to the source contact trench and electrically connected to the conductive material in the source contact trench.

According to an embodiment, a method of manufacturing a semiconductor device in a semiconductor substrate having a first main surface comprises forming a source region, forming a drain region, forming a body region, and forming a gate electrode at the body region. The gate electrode is configured to control a conductivity of a channel formed in the body region and the gate electrode is formed in gate trenches. The body region is formed to be disposed along a first direction between the source region and the drain region, the first direction being parallel to the first main surface. The body region has a shape of a first ridge extending along the first direction, the body region being adjacent to the source region and the drain region. The method further comprises forming a source contact and a body contact, the source contact being electrically connected to a source terminal. The body contact is formed to be electrically connected to the source contact and to the body region.

According to a further embodiment, a semiconductor device comprises a field effect transistor in a semiconductor substrate having a first main surface. The field effect transistor comprises a source region (201); a drain region (205); a body region (220); and a gate electrode (210) at the body region (220). The gate electrode is configured to control a conductivity of a channel formed in the body region. The gate electrode is disposed in gate trenches. The body region is disposed along a first direction between the source region and the drain region, the first direction being parallel to the first main surface. The body region has a shape of a ridge extending along the first direction, the body region being adjacent to the source region and the drain region. The semiconductor device further comprises a source contact and a body contact. The source contact is electrically connected to a source terminal, and the body contact is in contact with the source contact and is electrically connected to the body region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 1A shows a vertical cross-sectional view of a semiconductor device according to an embodiment.

FIG. 1B shows a horizontal cross-sectional view of a semiconductor device according to the embodiment.

FIGS. 2A to 2C show cross-sectional views of a semiconductor device according to a further embodiment.

FIGS. 3A to 8B illustrate cross-sectional views of a semiconductor substrate when manufacturing a semiconductor device according to an embodiment.

FIGS. 9A to 11B illustrate cross-sectional views of a semiconductor substrate when performing a modification of the method of manufacturing a semiconductor device.

DETAILED DESCRIPTION

Figure 1C:
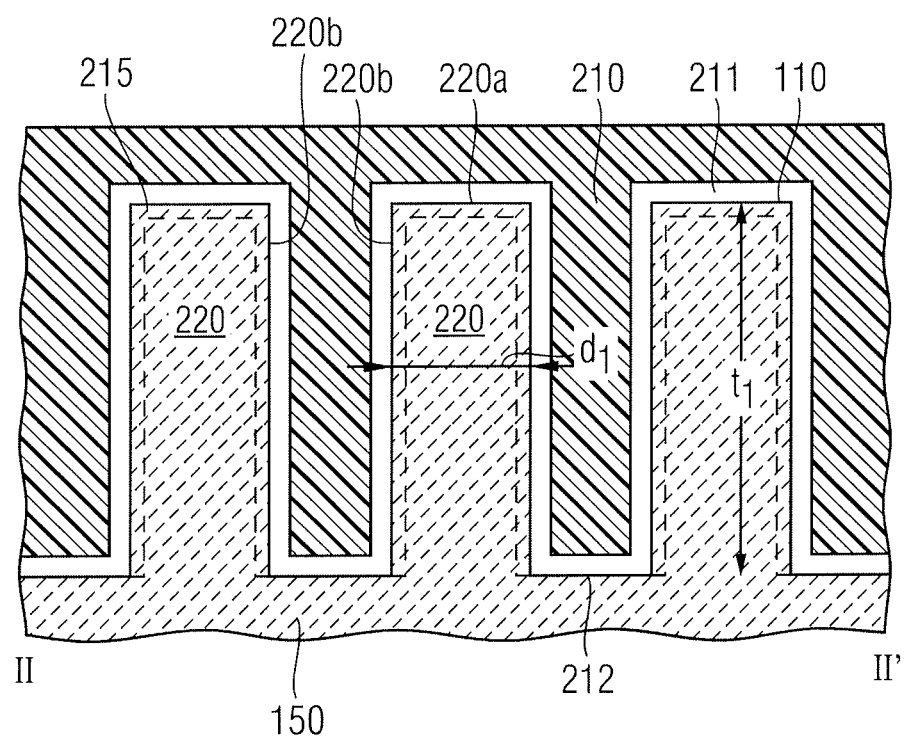
FIG. 1C shows a further vertical cross-sectional view of the embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, i.e. whether the current flows from source to drain or vice versa. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

FIG. 1A shows a vertical cross-sectional view of a semiconductor device according to an embodiment. The semiconductor device 1 comprises a field effect transistor 200 formed in a semiconductor substrate 100 having a first main surface 110. The field effect transistor comprises a source region 201, a drain region 205, a body region 220, and a gate electrode 210 at the body region 220. The gate electrode 210 is configured to control a conductivity of a channel formed in the body region 220. The gate electrode 210 is disposed in gate trenches 212. The position of the gate trenches 212 is indicated by dashed lines in the cross-sectional view of FIG. 1A. The trenches 212 are disposed before and behind the depicted plane of the drawing. The body region 220 is disposed along a first direction, e.g. the x direction, between the source region 201 and the drain region 205. The first direction is parallel to the first main surface 110.

As will be explained in more detail with reference to FIG. 1C, the body region 220 has a shape of ridge extending along the first direction. The body region 220 is adjacent to the source region 201 and the drain region 205. The body region 220 contacts the source region 201 and contacts the drain region 205. For example, a drift zone may be absent from the semiconductor device. In particular, a drift zone may not be arranged between the body region and the drain region 205. The semiconductor device 1 further comprises a source contact 202 and a body contact 225. The source contact 202 is electrically connected to the source region 201. The body contact 225 may be disposed in the semiconductor substrate 100 adjacent to the source contact 202. The body contact 225 is electrically connected to the source contact 202 and to the body region 220.

The body region 220 may be of the first conductivity type, e.g. p-type. The source region 201 and the drain region 205 may be of the second conductivity type, e.g. n-type.

The semiconductor substrate 100 may comprise a first (bottom) layer 130 of the first conductivity type and an epitaxially grown second layer 140 of the second conductivity type formed over the first layer 130. A further buried layer 135 of the second conductivity type may be disposed between the first layer 130 of the first conductivity type and the second layer 140 of the second conductivity type. The buried layer 135 may be doped at a higher doping concentration than the second layer 140 of the second conductivity type.

The components of the field effect transistor 200 may be formed in a well of a first conductivity type, e.g. p-type. The first well region 150 may be formed in the second semiconductor layer 140 of the second conductivity type.

The second layer 140 of the second conductivity type may be contacted via a substrate contact 292. A doped portion 291 of the second conductivity type may be disposed between the substrate contact 292 and the second layer 140 of the second conductivity type. The substrate contact 292 may be electrically coupled to a contact terminal 293.

As is illustrated in FIG. 1A, a pn junction between the second layer 140 and the well region 150 may be disposed adjacent to the first main surface 110 of the semiconductor substrate 100. This portion may be covered by an insulating layer portion 281. A field plate 280 may be disposed adjacent to the insulating layer 281. Thereby, electrical fields in the vicinity of the pn junction may be appropriately shaped. In particular, components above the substrate surface may be protected against electrical fields caused by the pn junction. Moreover, the pn junction is protected against electrical fields caused by components disposed over the substrate surface, such as metallization layers. In particular, a breakdown voltage may be shifted due to the presence of the field plate 280.

FIG. 1B shows a horizontal cross-sectional view of the semiconductor device 1 illustrated in FIG. 1A. The horizontal view is taken so as to intersect the gate trenches 212, the source contact 202, the drain contact 206 and the contact plug 292. As is shown, the source contact 202, the drain contact 206 and the substrate contact 292 may be formed in respective trenches that may extend along the second direction (e.g. y direction) which is perpendicular to the first direction. The source region 201 is formed adjacent to a sidewall of a contact trench 321 in which the source contact 202 is disposed. Further, the drain region 205 may be disposed adjacent to the sidewall and a bottom side of a contact trench 322, in which the drain contact 206 is disposed. The substrate contact 292 is further formed in a contact trench 323. Sidewalls and the bottom side of the contact trench 323 may be doped to form the doped portion 291.

FIG. 1C shows a cross-sectional view of the semiconductor device 1 between II and II', as is also illustrated in FIG. 1B. The cross-sectional view of FIG. 1C is taken so as to intersect a plurality of gate trenches 212. As is illustrated, the semiconductor material of the first conductivity type is patterned by adjacent trenches 212. Due to the patterning, separated lamellas of semiconductor material forming the single ridges may be formed. The ridges comprise a top surface 220a and sidewalls 220b. A gate dielectric layer 211 is disposed adjacent to the sidewalls 220b and the top surface 220a of each of the ridges. Further, a conductive material is filled in the trenches between adjacent ridges to form the gate electrode 210. As has been explained, the body region 220 has the shape of a ridge extending in the first direction or of a fin. More particularly, the body region 220 is patterned into a ridge by adjacent trenches that extend in the first direction. The sidewalls 220b may extend perpendicularly or at an angle of more than 75° with respect to the first main surface 110. The gate electrode 210 may be disposed adjacent to at two sidewalls of the ridge. Moreover, the top surface 220a and the sidewalls 220b of the ridge may not be implemented as completely straight lines. For example, the points of intersection between the top surface 220a and the sidewalls 220b may be implemented as rounded corners. Likewise, the bottom portions of the gate trenches 212 may form rounded corners to the sidewalls 220b of the ridges.

According to an embodiment, the width d1 of the ridge is d1>2×ld, wherein ld denotes a length of a depletion zone which is formed at the interface between the gate dielectric layer 211 and the channel region 220. Generally, it is assumed that in a transistor, the length of the depletion zone at a gate voltage corresponding to the threshold voltage corresponds to the maximum width of the depletion zone. For example, the width of the depletion zone may be determined as:

$$l_d = \sqrt{\frac{4\varepsilon_s kT\ln(N_A/n_i)}{q^2 N_A}}$$

wherein $\varepsilon_s$ denotes the permittivity of the semiconductor material ($11.9*\varepsilon_0$ for silicon), k denotes the Boltzmann constant ($1.38066*10^{-23}$ J/K), T denotes the temperature, e.g. 293K, ln denotes the natural logarithm, $N_A$ denotes the impurity concentration of the semiconductor body, $n_i$ denotes the intrinsic carrier concentration ($1.45*10^{10}$ for silicon at 27° C.), q denotes the elementary charge ($1.6*10^{-19}$ C).

In particular, the channel regions 215 formed at opposing sidewalls 220b of a ridge may not merge with each other so that the body region 220 may be connected to the body contact region 225 along the entire length of the body region 220. For example, the width of the trenches may be approximately 20 to 1000 nm, for example, more than 200 nm along the first main surface 110 of the semiconductor substrate 100. Further, the distance between adjacent trenches that corresponds to the width d1 of the ridges may be larger than 100 nm, for example more than 130 nm, e.g. even more than 200, 300, 400 or 500 nm. According to a further embodiment, the width d1 of the ridge is d1<2×ld, wherein ld denotes the length of a depletion zone which is formed at the interface between the gate dielectric layer 211 and the channel region 220. In this case, the channel regions formed in the ridges at opposing sidewalls 220b of the ridge may physically contact each other, when, for example, a voltage corresponding to the threshold voltage is applied to the gate terminal. According to the embodiment the body region 220 may fully depleted when the gate electrode is set to an appropriate potential. Such a transistor is also referred to as a "fully depleted" transistor. In such a transistor, an optimal sub-threshold voltage can be achieved and short channel effects may be efficiently suppressed, resulting in improved device characteristics. According to this embodiment, the width of the ridges may be approximately 20 to 130 nm, e.g. 40 to 120 nm along the second direction and parallel to the first main surface 110 of the semiconductor substrate 100.

When the transistor is switched on, e.g. by applying a suitable voltage to the gate electrode 210, a conductive inversion layer 215 (conductive channel) is formed at the boundary between the body region 220 and the gate dielectric 211. Accordingly, the transistor is in a conducting state from the source region 201 to the drain region 205. In case of switching off, no conductive inversion layer is formed and the transistor is in a non-conducting state.

The transistor may, for example, withstand a blocking voltage in a range of 0.3 to 10 V, e.g. 1.4 V to approximately 4 V in an off-state between source region 201 and drain region 205. Currents flowing in an on-state may be up to approximately 1.5 Amperes or more. Due to the special configuration of the body region which has the shape of a ridge, a higher effective channel width may be achieved at a reduced device area. Further, leakage currents may be reduced since short channel effects may be better suppressed. As a result, the effective width of the transistor may be largely increased without increasing the lateral extension of the transistor.

According to an embodiment, the source region 201 may extend to at least 0.5×the depth of the gate trenches 212. As a result, the body region 220 may be connected to the source region 201 over a large extension depth. Thereby, the effective channel width may be further increased. Due to the presence of the body contact portions 225, a low-ohmic contact of the body region 220 to a source terminal 271 via the source contacts 202 is accomplished and a parasitic bipolar transistor may be deteriorated or suppressed.

Due to the specific configuration, according to which the semiconductor device is formed in a well region 150 of the first conductivity type, e.g. a p-type well which is formed in the second layer 140 of the second conductivity type, leakage currents may be prevented from flowing to the substrate. Due to the presence of the buried layer 135 a higher robustness with respect to the first (p-doped) layer 130 may be achieved. For example, when holes are injected from the substrate, the buried layer 135 protects the semiconductor device against the injection of holes.

According to a different interpretation, the semiconductor device illustrated in FIGS. 1A to 1C may understood as a semiconductor device comprising a field effect transistor 200 formed in a semiconductor substrate 100 having a first main surface 110. The field effect transistor 200 includes a source contact trench 321 and a drain contact trench 322, each running in a second direction parallel to the first main surface. A conductive material is formed in the source contact trench 321 and in the drain contact trench 322, each being formed in the first main surface. The field effect transistor 200 further comprises gate electrode structures 210 and body regions 220 extending between the source contact trench 321 and the drain contact trench 322. The gate electrode structures 210 and the body regions 220 are arranged in an alternating manner along the second direction, e.g. the y direction. The field effect transistor 200 further comprises a source region 201 electrically connected to the source contact 202 in the source contact trench 321 and adjacent to the body region 220. The field effect transistor 200 further comprises drain regions 205 electrically connected to the drain contact 206 in the drain contact trench 322 and adjacent to the body regions 220. The field effect transistor further comprises a body contact 225 adjacent to the source contact groove and electrically connected to the source contact 202 in the source contact trench 321.

FIGS. 2A and 2B show cross-sectional views of a semiconductor device according to a further embodiment. In addition to the components of the field effect transistor illustrated in FIGS. 1A to 10, the field effect transistor 200 of the semiconductor device 1 shown in FIG. 2A further comprises a source connection portion 201b disposed in contact with the body region 220, further being in contact with the source region 201. Moreover, the field effect transistor may comprise a drain connection portion in contact with the body region 220. The drain connection portion further is in contact with the drain region 205. As is further illustrated in FIG. 2A, the drain contact 206 may directly contact the well region 150 while the drain region 205 may be absent from a bottom side of the drain contact 206.

FIG. 2B shows a horizontal cross-sectional view of the semiconductor device. As is illustrated, the source connection portions 201b are disposed adjacent to the gate trenches 212, and source connection portions 201b assigned to adjacent trenches are insulated from each other. Likewise, the drain connection portions are disposed adjacent to a sidewall of the gate trenches 212. Further, drain connection portions 205b that are assigned to different trenches, are separated from each other.

FIG. 2C shows a cross-sectional view which is taken between IV and IV', as is also illustrated in FIG. 2B. In more detail, the cross-sectional view of the FIG. 2C is taken so as to intersect the gate trenches 212. As is illustrated, the source connection portion 201b is disposed between the gate trench 212 and the source region 201, and the drain connection portion 205b is disposed between the gate trench 212 and the drain region 205.

In the following, an example of a method of manufacturing the semiconductor device of the embodiment of FIGS. 2A to 2C will be illustrated. In particular, a method will be illustrated according to which the source connection portion 201b and the drain connection portion 205b are formed in a self-aligned manner with respect to the gate trench 212. Due to the self-alignment, overlay variations of the source or drain contact trench 321, 322 to the gate trench 212 may be compensated for. In particular, on one side, a short-circuit between the source region 201 and the gate electrode 210 or the drain region 205 and the gate electrode 210 may be avoided. At the same time, a doping profile at the source/body junction or the body/drain junction is improved. As a result, a contact resistance between the metal of the source contact 202 or the drain contact 206 and the body region 220 may be decreased.

Starting point for forming a semiconductor device may be a semiconductor substrate 100 including a first layer 130 of the first conductivity type, a second layer 140 of the second conductivity type and a buried layer 135 of the second conductivity type doped at a higher doping concentration than the second layer 140 and disposed between the first layer 130 and the second layer 140. For example, the buried doped layer 135 may be formed by an implantation step and driving in the dopants. The second layer 140 of the second conductivity type may be formed by epitaxially growing semiconductor material over the buried layer 135. A well region 150 doped with the first conductivity type is defined in the second layer of the second conductivity type. The well region 150 may be formed by a masked ion implantation process. As is to be readily understood, any of these portions may be formed by different processes. An exposed horizontal surface portion of the second layer 140 and a surface portion of the well region 150 define a first main surface 110.

Figure 3A:
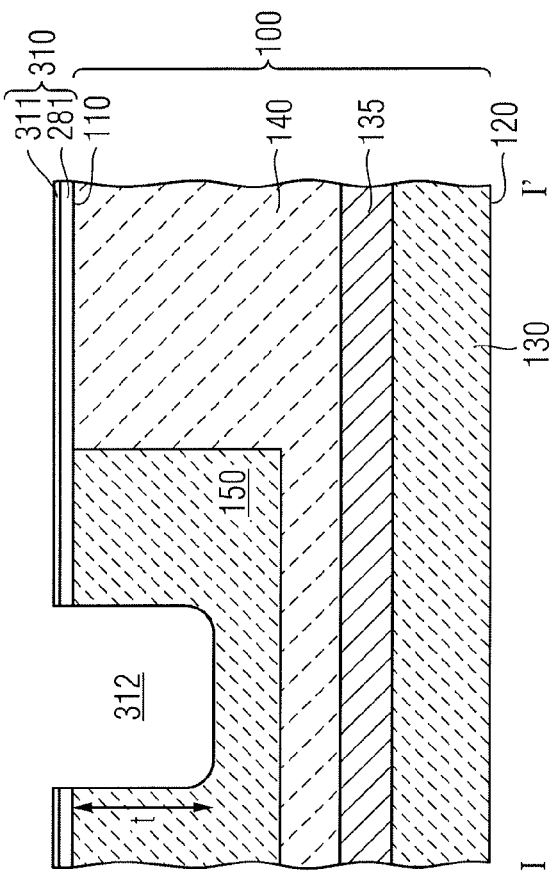
Figure 3B:
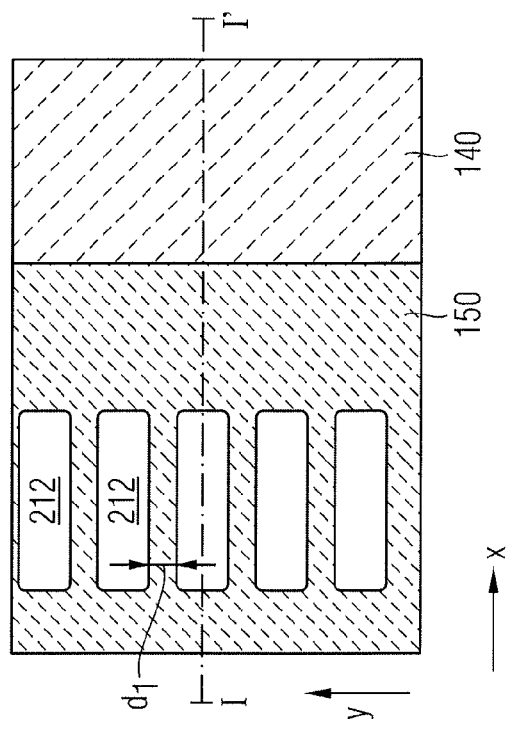

A hard mask layer stack 310 comprising, e.g. a silicon oxide layer 281 and a silicon nitride layer 311 may be formed over the first main surface 110. Thereafter, gate trenches 212 may be photolithographically defined in the first main surface 110. For example, the gate trenches may be etched to a depth of approximately 1 to 2 μm. Further, a distance d1 between adjacent gate trenches 212 may be 50 to 500 nm. FIG. 3A shows a vertical cross-sectional view of an example of a resulting structure. Further, FIG. 3B shows a horizontal cross-sectional view of an example of a resulting structure. As is shown, the gate trenches 212 are disposed at a distance d1. A plurality of gate trenches 212 are arranged along the second direction, e.g. the y direction. Further, the gate trenches 212 extend in the first direction, e.g. the x direction.

In the next step, a doped silicate glass layer may be formed in the gate trenches 212. For example, the doped glass layer 312 may comprise an arsenic silicate glass or a phosphosilicate glass.

Figures 4A, 4B:
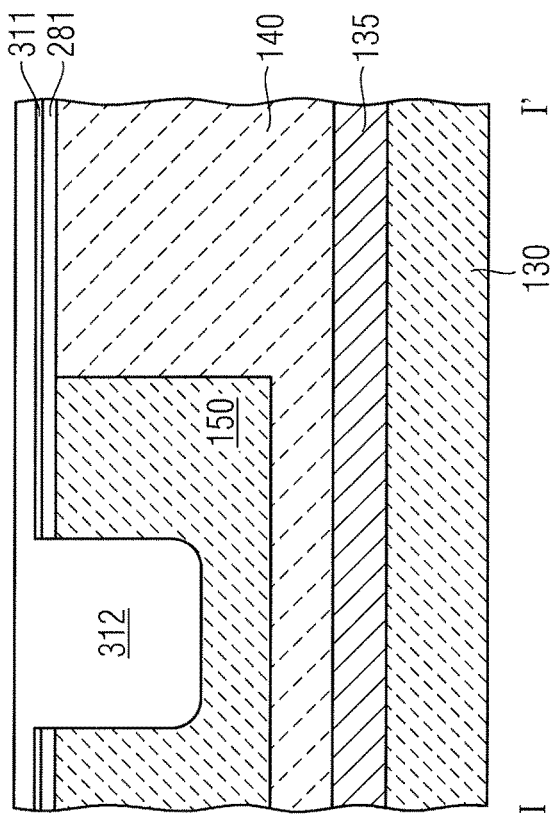

FIGS. 4A and 4B show cross-sectional views of examples of resulting structures. As is shown in FIG. 4A showing a vertical cross-sectional view, the doped glass layer 312 fills the gate trenches 212 and is formed over the hard mask layer stack 311.

Thereafter, a further lithographic is performed so as to define the channel region. In more detail, portions of the doped glass layer 312 are covered with a photoresist material leaving the central portions of the gate trenches 212 uncovered. Then, using this patterned photoresist layer as an etching mask, an etching step is performed so as to remove the doped glass from the central portion of the gate trenches 212. As a result, the doped silicon glass remains adjacent to the right-hand sidewall of the trench and the left-hand sidewall of the gate trench 212, when viewed perpendicular to the first direction. Then, a thermal processing step is performed. For example, this may be accomplished at a temperature of about 900 to 1100° C. for approximately 1 to 60 seconds. As a result, the dopants included in the doped glass layer 312 diffuse into the well region 150 to form a source connection portion 201b and a drain connection portion 205b. The source connection portion 201b may be disposed adjacent to a left-hand sidewall of the gate trench 212. Moreover, the drain connection portion may be disposed adjacent to a right-hand sidewall of the gate trench 212. A portion of the source connection portion 201b extends below the gate trench 212. Moreover, a portion of the drain connection portion extends below the gate trench 212.

FIG. 5A shows an example of a resulting structure. Further, FIG. 5B shows a horizontal cross-sectional view of an example of a resulting structure. As is illustrated, the source connection portion 201b is disposed so as to surround the left-hand side of the gate trench 212. Likewise, the drain connection portion is disposed so as to surround the right-hand side of the gate trench 212. Source connection portions 201b assigned to adjacent gate trenches 212 do not contact each other. A portion of the doped well region 150 is disposed between adjacent connection portions 201b.

Thereafter, a dielectric layer may be formed on the sidewalls and the bottom side of the gate trenches 212. Thereafter, doped polysilicon may be formed in the gate trenches 212. Thereafter, the gate electrodes 210 may be patterned. For example, this may be accomplished by performing a photolithographical process, followed by an etching step. Alternatively, this may be accomplished by a CMP ("chemical mechanical polishing") step.

Figure 6A:
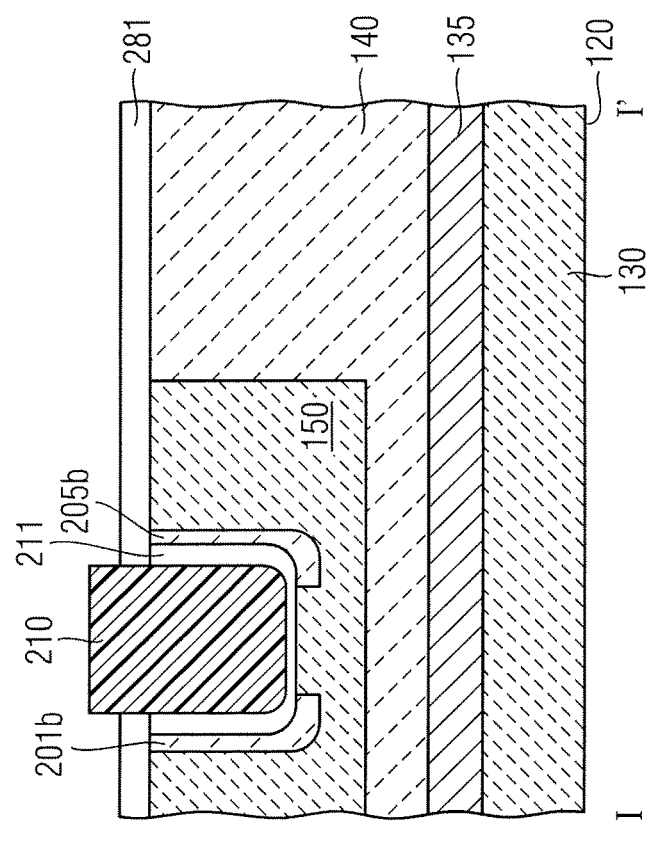
Figure 6B:
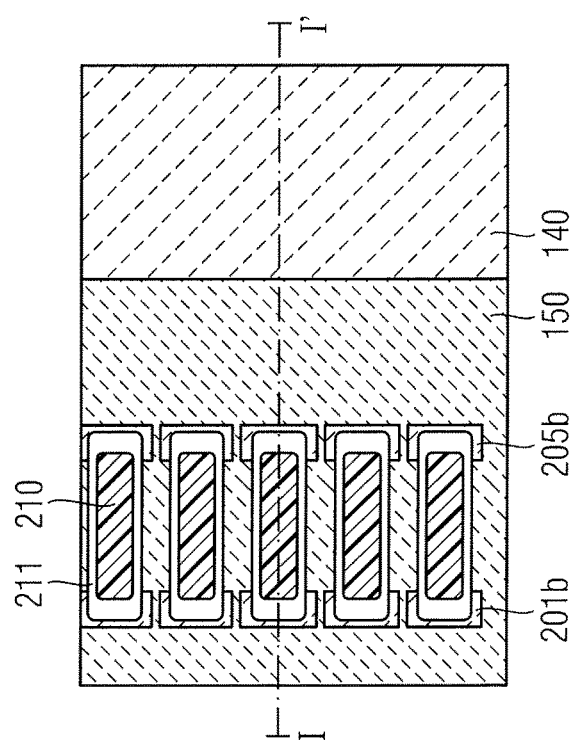

FIGS. 6A and 6B show cross-sectional views of an example of a resulting structure. As is shown in FIG. 6A showing a vertical cross-sectional view, the gate electrode 210 is disposed in the gate trenches 212. The gate electrode 210 is insulated from adjacent substrate material by the gate dielectric layer 211. FIG. 6B shows a horizontal cross-sectional view intersecting a plurality of gate trenches 212.

In the next steps, contact trenches for contacting the transistor and the second layer 140 of the second conductivity type are defined. For example, this may be accomplished by forming a further hard mask layer 282 over the structure so as to cover the gate electrode 210. Thereafter, contact trenches 321, 322, 323 for defining the source contact, the drain contact and the substrate contact may be defined. For example, the source contact trench 321 may extend to a depth of more than 0.5×the depth of the gate trenches. The drain contact trenches 322 may extend to a similar depth as the source contact trench 321.

FIG. 7A shows a vertical cross-sectional view of a resulting structure. As is shown, a source contact trench 321, a drain contact trench 322 are formed in the well region 150. Further, the substrate contact trench 323 is disposed in the second layer 140 of the second conductivity type. FIG. 7B shows a horizontal cross-sectional view. As is shown, each of the source trench 321, the drain contact trench 322 and the substrate contact trench 323 extend along the second direction, e.g. the y direction.

Thereafter, doping steps are performed so as to complete the source region 201, the drain region 205, the substrate contacts 291 and for further defining the body contact 225. For example, this may comprise performing an ion implantation step with dopants of the second conductivity type (e.g. n+). According to an embodiment, this may be a tilted ion implantation step so as to dope the sidewalls of the source contact trench 321, the drain contact trench 322 and the substrate contact trench 323. As a result, the sidewalls of the substrate material adjacent to any of these trenches will be doped with dopants of the second conductivity type. Further, a lithographic step may be performed to cover the drain contact trench 322 and the substrate contact trench 323. Thereafter, a vertical implantation step may be performed for defining the body contact 225 at the bottom side of the source contact trench 321. Then, a thermal treatment, for example a rapid thermal annealing step may be performed, e.g. at about 900 to 1100° C. for approximately 1 to 60 seconds, so as to complete the doping process.

Figure 8A:
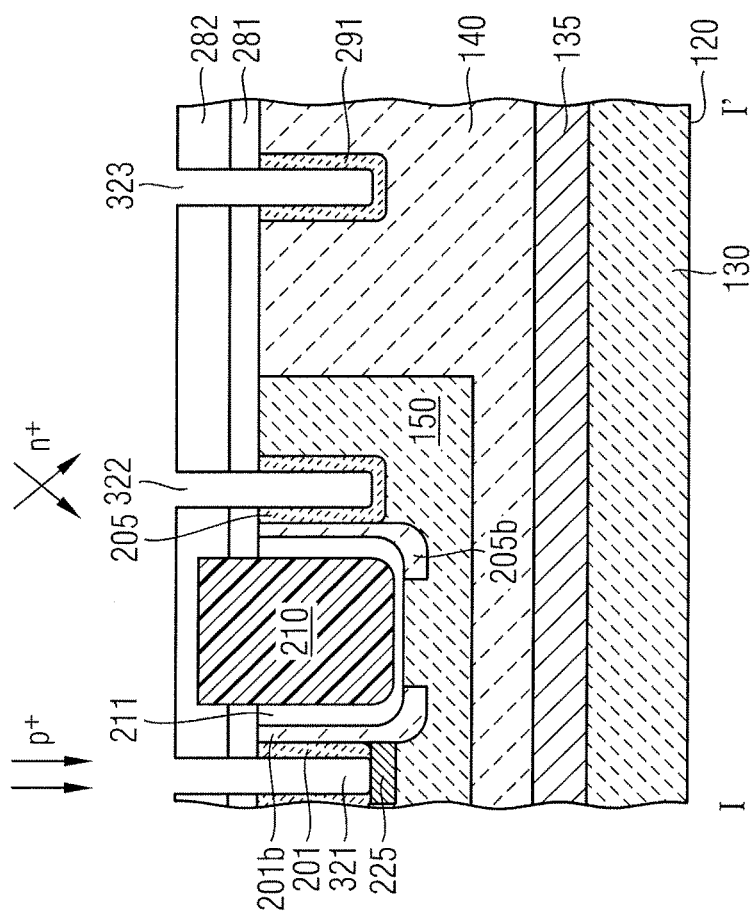
Figure 8B:
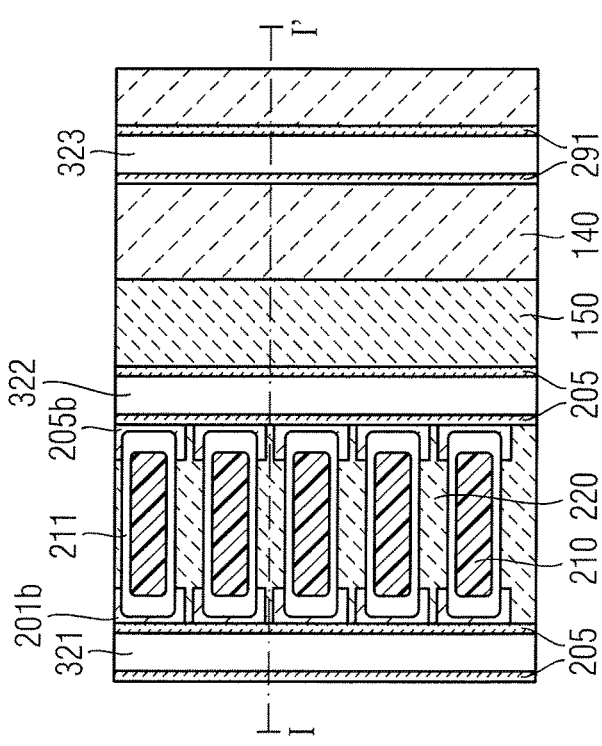

FIG. 8A shows a vertical cross-sectional view of a resulting structure. As is shown, doped portions of the second conductivity type are disposed adjacent to the sidewalls of the trenches 321, 322 and 323. Moreover, the body contact portion 225 is formed at a bottom portion of the source contact trench 321. The body contact portion 225 is disposed in electrical and physical contact with the well region 150 of the first conductivity type. FIG. 8B shows a horizontal cross-sectional view of a resulting structure.

Thereafter, the conductive material may be filled in each of the source contact trench 321, the drain contact trench 322 and the substrate contact trench 323. For example, a barrier layer of Ti/TiN may be formed in any of these trenches, followed by a step of depositing tungsten. As is clearly to be understood, alternative materials may be used for defining the conductive material of the source electrode, the drain electrode and the substrate contact. As a result, the structure shown in FIGS. 2A and 2B is obtained.

FIGS. 9A to 11B illustrate a modification of this process starting from the structure illustrated in FIGS. 5A and 5B. After performing the thermal treatment step so as to diffuse the dopants in the well region 150, the remaining portions of the doped oxide 312 are entirely removed from the gate trenches 212 and a cleaning step is performed. Thereafter, a gate dielectric layer 211 is formed adjacent to the sidewalls and the bottom side of the gate trenches 212, followed by a step of filling polysilicon into the gate trenches 212. Then, the polysilicon is patterned to form the gate electrode 210. For example, this may be accomplished using a photolithographical step followed by an etching process. Alternatively, a CMP step may be performed.

Figure 9A:
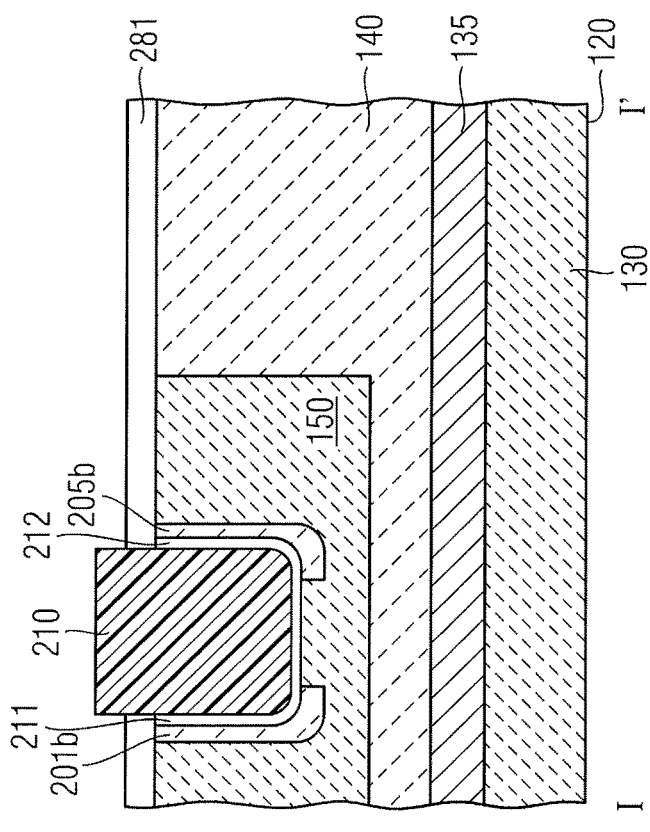
Figure 9B:
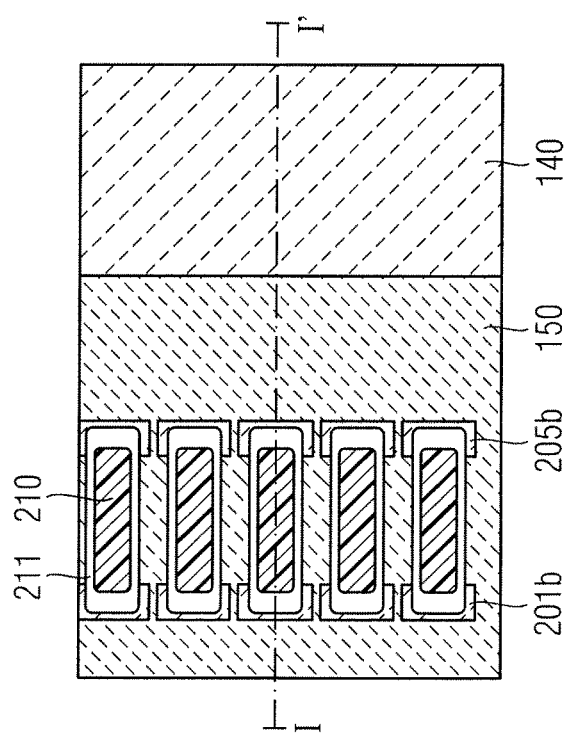

FIGS. 9A and 9B show cross-sectional views of an example of a resulting structure. Thereafter, one or more source contact trenches 321, drain contact trenches 322 and substrate contact trenches 323 may be formed in a similar manner as has been discussed with reference to FIGS. 7A and 7B.

FIGS. 10A and 10B show cross-sectional views of resulting structures. Thereafter, doping processes may be performed so as to complete the source region 201, the drain region 205 and the substrate contact 291. Moreover, a doping process is performed so as to define the body contact 225. The doping processes may be performed in a similar manner as has been discussed before with reference to FIGS. 8A and 8B.

As a result, the structure illustrated in FIGS. 11A and 11B may be obtained. As is shown, the source region 201 is disposed adjacent to the sidewall of the source trench 321. Further, the drain region 205 is disposed adjacent to a sidewall of the drain contact trench 322. The substrate contact 291 is disposed at a sidewall of the substrate contact trench 323. The body contact 225 is disposed adjacent to a bottom side of the source contact trench 321. Thereafter, a conductive material may be filled in the source contact trench 321, the drain contact trench 322 and the substrate contact trench 323 in a similar manner as has been discussed above. As a result, the structure shown in FIGS. 2A and 2B may be obtained.

Figure 12:
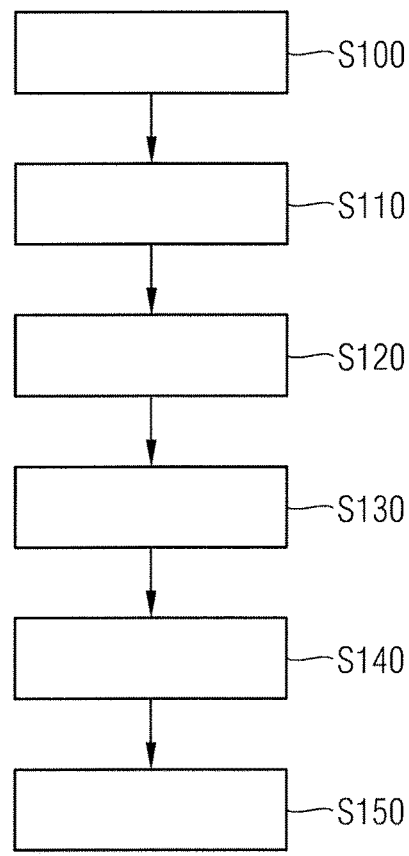
FIG. 12 summarizes methods according to embodiments.

FIG. 12 summarizes a method for manufacturing the semiconductor device according to an embodiment.

As is illustrated, a method of manufacturing a semiconductor device in a semiconductor substrate having a first main surface comprises forming a source region (S100), forming a drain region (S110), forming a body region (S120), and forming a gate electrode (S130) at the body region, the gate electrode being configured to control a conductivity of a channel formed in the body region, the gate electrode being formed in gate trenches, the body region being formed to be disposed along a first direction between the source region and the drain region, the first direction being parallel to the first main surface, the body region having a shape of a first ridge extending along the first direction, the body region being adjacent to the source region and the drain region. The method further comprises forming a source contact (S140) and forming a body contact (S150), the source contact being electrically connected to a source terminal, the body contact being formed to be electrically connected to the source contact and to the body region. Even though FIG. 12 indicates a specific succession of the different single processes, it is clearly to be understood that this succession may be modified by rearranging the single processes. Further several processes may be concurrently performed by joint processing methods.

The semiconductor device 1 described herein comprises a plurality of single field effect transistors 200 which may be connected in parallel. E.g. the plurality of parallel transistors 200 may comprise a common source contact or electrode 202 disposed in the source contact trench 321 and a common drain contact or electrode 206 disposed in the drain contact trench 322. The pattern of the single transistors may be repeated and mirrored along the first and the second directions.

The semiconductor device according to an embodiment may be suitably used as a low voltage power switch or transistor, e.g. as a low-ohmic low voltage switch. For example, the term "low voltage" may refer to source-drain voltages of approximately 10 to 15V. According to a specific application, an integrated circuit for switching single elements of an array may comprise semiconductor devices according to embodiments. For example, the single elements may be driven independently from each other at a comparable low voltage.

Figure 13:
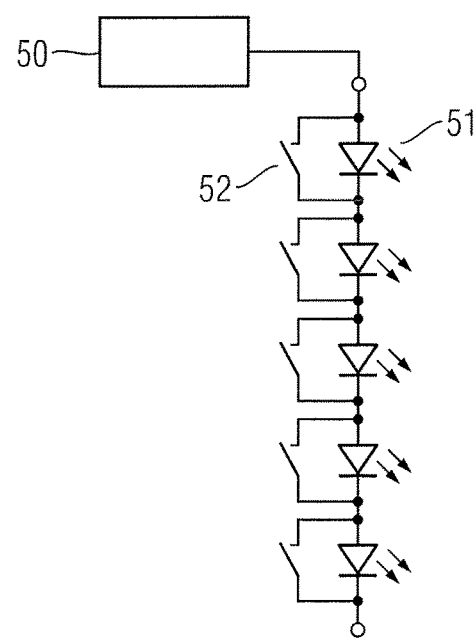
FIG. 13 shows an equivalent circuit diagram of an integrated circuit including the semiconductor device.

FIG. 13 shows an equivalent circuit diagram of an integrated circuit for switching an array of LEDs ("light emitting diodes") 51 that are connected in series with a current regulator 50. For example, the forward voltage of such an LED 51 may be approximately 1.4 V to approximately 6 V, and currents may be up to 1.5 A. The single LEDs 51 may be driven independently from each other by switches 52. The switches 52 may comprise semiconductor devices according to embodiments.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device comprising an array of field effect transistors in a semiconductor substrate having a first main surface, the array of field effect transistors including:
   a source contact trench and a drain contact trench, each running in a second direction parallel to the first surface, a conductive material in the source contact trench forming a source contact and a conductive material in the drain contact trench forming a drain contact, the source contact trench and the drain contact trench being formed in the first main surface;
   gate electrode structures and body regions, extending between the source contact trench and the drain contact trench, the gate electrode structures and the body regions being arranged in an alternating manner along the second direction,
   a source region electrically connected to the conductive material in the source contact trench and adjacent to the body regions and a drain region directly adjacent to the drain contact and electrically connected to the conductive material in the drain contact trench and directly adjacent to the body regions, and
   a body contact adjacent to the source contact trench and electrically connected to the conductive material in the source contact trench.

2. The semiconductor device according to claim 1, wherein the body contact is disposed beneath the source contact trench.

3. The semiconductor device according to claim 1, wherein the source contact extends in a depth direction in the semiconductor substrate to at least 0.5×the depth of the gate trenches.

4. The semiconductor device according to claim 1, wherein the semiconductor substrate comprises a first layer of a first conductivity type, a second layer of a second conductivity type, layered over the first layer, and a well region of the first conductivity type, formed in the second layer.

5. The semiconductor device according to claim 4, wherein the field effect transistor is formed in the well region.

6. The semiconductor device according to claim 4, further comprising a buried layer of the second conductivity type, disposed between the first semiconductor layer and the second semiconductor layer.

7. The semiconductor device according to claim 1, wherein a width of the ridge d1 fulfills: d1>2×ld, wherein ld denotes a length of a depletion zone which is formed at the interface between a gate dielectric layer and the channel region.

8. The semiconductor device according to claim 1, wherein the source region comprises source connection portions in contact with the body portion, the source connection portions being adjacent to the gate trenches.

9. The semiconductor device according to claim 1, being operable as a low-voltage power transistor.

10. The semiconductor device of claim 1, wherein the semiconductor device is within an integrated circuit.

11. The semiconductor device according to claim 10, being configured to independently switch single elements of an array of elements.

12. A method of manufacturing a semiconductor device in a semiconductor substrate having a first main surface comprising:
   forming a source region;
   forming a drain region;
   forming a body region;
   and forming a gate electrode at the body region, the gate electrode being configured to control a conductivity of a channel formed in the body region, the gate electrode being formed in gate trenches,
   the body region being formed to be disposed along a first direction between the source region and the drain region, the first direction being parallel to the first main surface, the body region having a shape of a first ridge extending along the first direction, the body region being directly adjacent to the source region and directly adjacent to the drain region,
   the method further comprising forming a source contact, a drain contact and a body contact, the source contact being electrically connected to a source terminal, the body contact being formed to be electrically connected to the source contact and to the body region, the drain region being formed to be directly adjacent to the drain contact.

13. The method according to claim 12, wherein forming at least one of the source region and the drain region is performed self-aligned with respect to the gate trenches.

14. The method according to claim 13, wherein forming the at least one of the source region and the drain region comprises forming a doped material in the gate trenches followed by a heat treatment.

15. The method according to claim 12, further comprising forming contact trenches in the first main surface, the contact trenches extending in a second direction perpendicular to the first direction.

16. The method according to claim 15, further comprising a step of doping the sidewalls of the substrate material adjacent to the contact trenches.

17. The method according to claim 15, further comprising a step of doping a bottom side of the source contact trench so as to form the body contact.

18. A semiconductor device comprising a field effect transistor in a semiconductor substrate having a first main surface, comprising:
   a source region;
   a drain region;
   a body region;
   and a gate electrode at the body region, the gate electrode being configured to control a conductivity of a channel formed in the body region, the gate electrode being disposed in gate trenches,
   the body region being disposed along a first direction between the source region and the drain region, the first direction being parallel to the first main surface, the body region having a shape of a ridge extending along the first direction, the body region being directly adjacent to the source region and directly adjacent to the drain region,
   the semiconductor device further comprising a source contact, a drain contact and a body contact, the source contact being electrically connected to a source terminal, the body contact being in contact with the source contact and being electrically connected to the body region, the drain region being directly adjacent to the drain contact.

19. The semiconductor device according to claim 18, wherein the source contact is disposed in the semiconductor substrate adjacent to the source region.

20. The semiconductor device according to claim 18, wherein the body contact is disposed beneath the source contact.

* * * * *